US009479183B1

(12) United States Patent
Chen et al.

(10) Patent No.: US 9,479,183 B1
(45) Date of Patent: Oct. 25, 2016

(54) MEMORY STORAGE DEVICE HAVING CLOCK AND DATA RECOVERY CIRCUIT

(71) Applicant: PHISON ELECTRONICS CORP., Miaoli (TW)

(72) Inventors: Wei-Yung Chen, Hsinchu County (TW); Yu-Chiang Liao, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/745,470

(22) Filed: Jun. 22, 2015

(30) Foreign Application Priority Data

Apr. 16, 2015 (TW) .............................. 104112216 A

(51) Int. Cl.
| | | |
|---|---|---|
| *G11C 11/34* | (2006.01) |
| *G11C 7/00* | (2006.01) |
| *G11C 8/00* | (2006.01) |
| *H03L 7/08* | (2006.01) |
| *H03L 7/091* | (2006.01) |
| *H03L 7/099* | (2006.01) |
| *H03L 7/107* | (2006.01) |
| *G11C 7/22* | (2006.01) |

(52) U.S. Cl.
CPC .............. *H03L 7/0807* (2013.01); *G11C 7/22* (2013.01); *H03L 7/0802* (2013.01); *H03L 7/091* (2013.01); *H03L 7/099* (2013.01); *H03L 7/1072* (2013.01)

(58) Field of Classification Search
USPC ................... 365/185.17, 185.33, 194, 233.1, 365/233.11; 375/355, 362
See application file for complete search history.

(56) References Cited

U.S. PATENT DOCUMENTS 8,238,193 B2 * 8/2012 Kim ....................... H03H 11/26
365/233.11
8,295,106 B2 * 10/2012 Rhee ........................ G11C 7/22
365/194

(Continued)

FOREIGN PATENT DOCUMENTS

TW 201501471 1/2015

OTHER PUBLICATIONS

Zhuang et al., "A Multi-Level Phase/Frequency Detector for Clock and Data Recovery Applications", Canadian Conference on Electrical and Computer Engineering, 2005., May 1-4, 2005, pp. 828-330.

(Continued)

*Primary Examiner* — Trong Phan
(74) *Attorney, Agent, or Firm* — Jianq Chyun IP Office

(57) ABSTRACT

A memory storage device having a clock and data recovery circuit module are provided. The module includes sampling circuits, a first logic circuit module, a delay circuit module, a second logic circuit module, a frequency adjustment circuit and a clock control circuit. The sampling circuits sample a data signal according to reference clocks. The first logic circuit module performs a first logic operation according to a sampling result. The delay circuit module delays a result of the first logic operation. The second logic circuit module performs a second logic operation according to said result and the delayed first logic result. The frequency adjustment circuit outputs a frequency adjustment signal according to a result of the second logic operation, and the clock control circuit performs a phase locking accordingly. Therefore, a circuit complexity of the clock and data recovery circuit module may be reduced.

13 Claims, 10 Drawing Sheets

(56) References Cited

U.S. PATENT DOCUMENTS

| | | | | |
|---|---|---|---|---|
| 8,437,216 B2 * | 5/2013 | Oh | G11C 7/1087 |
| | | | 365/233.1 |
| 8,780,668 B2 * | 7/2014 | Bae | H03K 19/0966 |
| | | | 365/233.1 |
| 8,917,564 B2 * | 12/2014 | Yu | G11O 5/063 |
| | | | 365/194 |
| 8,989,329 B2 * | 3/2015 | Hammad | H04L 7/0079 |
| | | | 375/355 |
| 9,020,086 B2 * | 4/2015 | Chen | H03L 7/085 |
| | | | 375/355 |

OTHER PUBLICATIONS

"Office Action of Taiwan Counterpart Application", issued on May 11, 2016, p. 1-p. 8.

\* cited by examiner

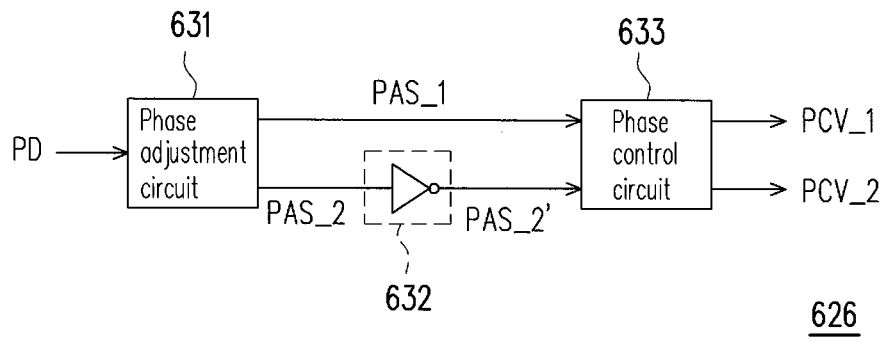
FIG. 6
| PAS_1 | PAS_2 | PAS_2' | Preset frequency shift | Actual frequency shift |
|---|---|---|---|---|
| 0 | 0 | 1 | +5MHz | 0MHz |
| 0 | 1 | 0 | 0MHz | −5MHz |
| 1 | 0 | 1 | +10MHz | +5MHz |
| 1 | 1 | 0 | +5MHz | 0MHz |
FIG. 7
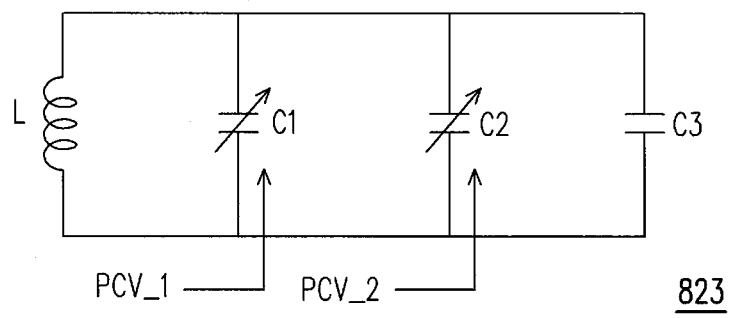
FIG. 8

US 9,479,183 B1

MEMORY STORAGE DEVICE HAVING CLOCK AND DATA RECOVERY CIRCUIT

CROSS REFERENCE TO RELATED APPLICATION

This application claims the priority benefit of Taiwan application serial no. 104112216, filed on Apr. 16, 2015. The entirety of the above-mentioned patent application is hereby incorporated by reference herein and made a part of specification.

BACKGROUND

1. Technical Field

The disclosure relates to a clock and data recovery circuit, and more particularly, to a clock and data recovery circuit module, a memory storage device and a phase lock method.

2. Description of Related Art

Generally, in a signal transmission system, a transmitter uses its clock to generate a data signal and then transmits said data signal to a receiver. As for the receiver, in order to correctly identify a logical level of the data signal, the receiver must read the data signal according to a clock that is synchronous with the clock of the transmitter. Therefore, the receiver often uses a clock and data recovery (CDR) circuit module to recover the clock of the transmitter.

In some specific cases, the receiver may detect a frequency of the data signal and sample a reference clock according to the detected frequency, so as to perform a phase lock that is relatively more accurate. However, sampling the reference clock by using the frequency of the data signal may result in larger system power consumption and a design cost may also be increased accordingly since a circuitry with high circuit complexity is required to process a sampling result.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

Accordingly, the disclosure is directed to a clock and data recovery circuit module, a memory storage device and a phase lock method, which are capable of reducing the system power consumption, reducing the circuit complexity and performing the accurate phase lock by changing a sampling method and a processing method for a sampling result.

An exemplary embodiment of the disclosure provides a clock and data recovery circuit module, which includes a data frequency detection circuit and a clock control circuit. The data frequency detection circuit includes a sampling circuit module, a first logic circuit module, a delay circuit module, a second logic circuit module and a frequency adjustment circuit. The sampling circuit module includes a plurality of sampling circuits and is configured to sample a data signal according to a plurality of reference clocks and output a sampling result. The first logic circuit module is coupled to the sampling circuits and configured to perform a first logic operation according to the sampling result and output a first logic result. The delay circuit module is coupled to the first logic circuit module and configured to delay the first logic result and output the delayed first logic result. The second logic circuit module is coupled to the delay circuit module and configured to perform a second logic operation according to the first logic result and the delayed first logic result and output a second logic result. The frequency adjustment circuit is coupled to the second logic circuit module and configured to output a first frequency adjustment signal according to the second logic result. The clock control circuit is coupled to the data frequency detection circuit and configured to perform a phase lock according to the first frequency adjustment signal and a frequency of the data signal.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of physical erasing units. The memory control circuit unit is coupled to the connection interface unit and the rewritable non-volatile memory module. The connection interface unit includes a clock and data recovery circuit module. The clock and data recovery circuit module includes a data frequency detection circuit and a clock control circuit. The data frequency detection circuit includes a sampling circuit module, a first logic circuit module, a delay circuit module, a second logic circuit module and a frequency adjustment circuit. The sampling circuit module includes a plurality of sampling circuits and is configured to sample a data signal according to a plurality of reference clocks and output a sampling result. The first logic circuit module is coupled to the sampling circuits and configured to perform a first logic operation according to the sampling result and output a first logic result. The delay circuit module is coupled to the first logic circuit module and configured to delay the first logic result and output the delayed first logic result. The second logic circuit module is coupled to the delay circuit module and configured to perform a second logic operation according to the first logic result and the delayed first logic result and output a second logic result. The frequency adjustment circuit is coupled to the second logic circuit module and configured to output a first frequency adjustment signal according to the second logic result. The clock control circuit is coupled to the data frequency detection circuit and configured to perform a phase lock according to the first frequency adjustment signal and a frequency of the data signal.

Another exemplary embodiment of the disclosure provides a phase lock method, which includes: sampling a data signal according to a plurality of reference clocks and outputting a sampling result; performing a first logic operation according to the sampling result and outputting a first logic result; delaying the first logic result and outputting the delayed first logic result; performing a second logic operation according to the first logic result and the delayed first logic result and outputting a second logic result; outputting a first frequency adjustment signal according to the second logic result; and performing a phase lock according to the first frequency adjustment signal and a frequency of the data signal.

Another exemplary embodiment of the disclosure provides a clock and data recovery circuit module, which includes a phase detection circuit, a converter circuit and a voltage control oscillation circuit. The phase detection circuit is configured to detect a phase difference between a data signal and a feedback clock. The converter circuit is coupled to the phase detection circuit and configured to output a first phase control voltage and a second phase control voltage according to the phase difference. The voltage control oscillation circuit is coupled to the converter circuit. The voltage control oscillation circuit is configured to receive the first phase control voltage and the second phase control voltage and output the feedback clock according to the first phase control voltage and the second phase control voltage.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of physical erasing units. The memory control circuit unit is coupled to the connection interface unit and the rewritable non-volatile memory module. The connection interface unit includes a clock and data recovery circuit module. The clock and data recovery circuit module includes a phase detection circuit, a converter circuit and a voltage control oscillation circuit. The phase detection circuit is configured to detect a phase difference between a data signal and a feedback clock. The converter circuit is coupled to the phase detection circuit and configured to output a first phase control voltage and a second phase control voltage according to the phase difference. The voltage control oscillation circuit is coupled to the converter circuit. The voltage control oscillation circuit is configured to receive the first phase control voltage and the second phase control voltage and output the feedback clock according to the first phase control voltage and the second phase control voltage.

Another exemplary embodiment of the disclosure provides a phase lock method, which includes: detecting a phase difference between a data signal and a feedback clock; outputting a first phase control voltage and a second phase control voltage according to the phase difference; and receiving the first phase control voltage and the second phase control voltage and outputting the feedback clock according to the first phase control voltage and the second phase control voltage.

Based on the above, the disclosure is capable of sampling the data signal according to the reference clocks, and generating the corresponding frequency adjustment signal by performing the logic operations with lower complexity in order to perform subsequent process for the phase lock. Accordingly, as compared to the traditional clock and data recovery circuit, the disclosure may complete the phase lock based on lower system power consumption and lower circuit complexity.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 6 is a schematic diagram illustrating a converter circuit according to an exemplary embodiment of the disclosure.

FIG. 7 is a schematic diagram illustrating the corresponding frequency shifts based on the phase control signal according to an exemplary embodiment of the disclosure.

FIG. 8 is a schematic diagram illustrating a voltage control oscillation circuit according to an exemplary embodiment of the disclosure.

DESCRIPTION OF THE EMBODIMENTS

Figure 1:
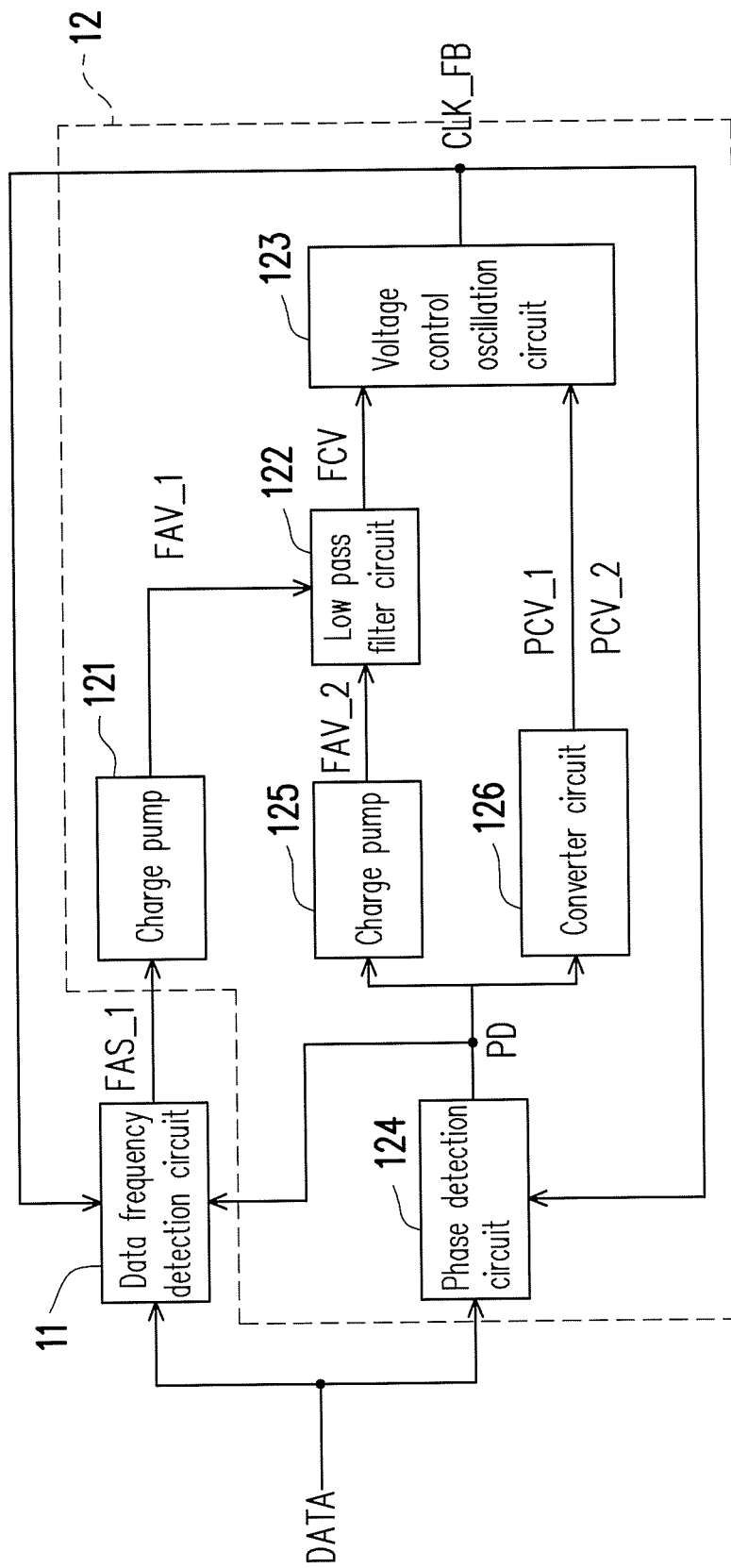
FIG. 1 is a schematic diagram illustrating a clock and data recovery circuit module according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A plurality of exemplary embodiments are provided below to describe the disclosure, though the disclosure is not limited to the provided exemplary embodiments, and the exemplary embodiments can also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signals.

FIG. 1 is a schematic diagram illustrating a clock and data recovery circuit module according to an exemplary embodiment of the disclosure.

Referring to FIG. 1, a clock and data recovery circuit module 10 includes a data frequency detection circuit 11 and a clock control circuit 12.

The data frequency detection circuit 11 is configured to sample a data signal DATA according to a plurality of reference clocks and output a frequency adjustment signal FAS_1 according to the obtained sampling result.

The clock control circuit 12 is coupled to the data frequency detection circuit 11. The clock control circuit 12 is configured to perform a phase lock according to the frequency adjustment signal FAS_1 and a frequency of the data signal DATA and output a clock (hereinafter, also known as a feedback clock) CLK_FB. In other words, the clock control circuit 12 adjusts a frequency of the feedback clock CLK_FB at least according to the output of the data frequency detection circuit 11.

In the present exemplary embodiment, the data frequency detection circuit 11 processes the sampling result and accordingly determines a relative relationship between a frequency of the feedback clock CLK_FB and the frequency of the data signal DATA. If the frequency of the feedback clock CLK_FB is lower than the frequency of the data signal DATA, the data frequency detection circuit 11 outputs the frequency adjustment signal FAS_1 configured to increase the frequency of the feedback clock CLK_FB. If the frequency of the feedback clock CLK_FB is higher than the frequency of the data signal DATA, the data frequency detection circuit 11 outputs the frequency adjustment signal FAS_1 configured to reduce the frequency of the feedback clock CLK_FB.

Figure 2:
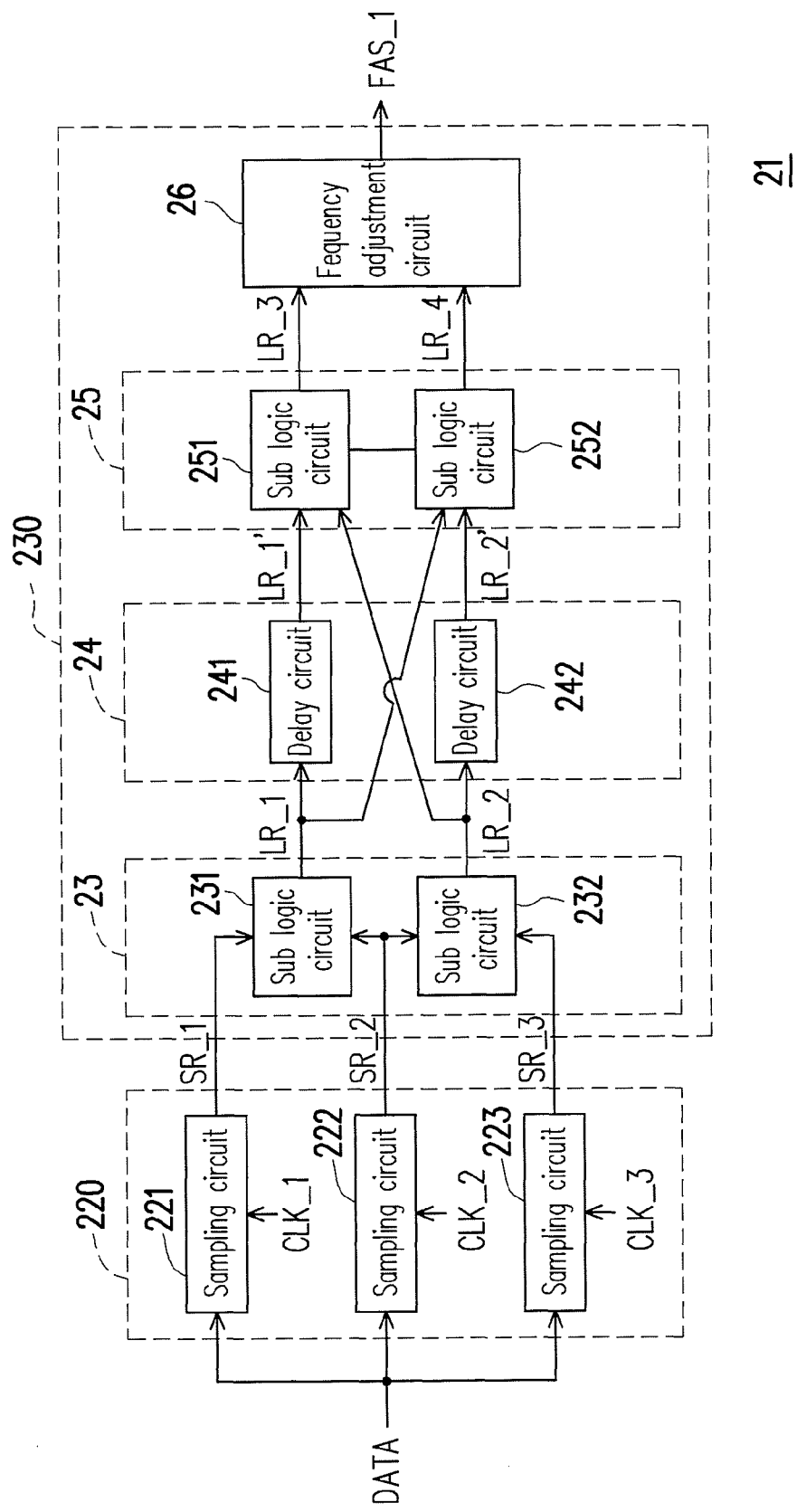
FIG. 2 is a schematic diagram illustrating a data frequency detection circuit according to an exemplary embodiment of the disclosure.

FIG. 2 is a schematic diagram illustrating a data frequency detection circuit according to an exemplary embodiment of the disclosure.

Referring to FIG. 2, the data frequency detection circuit 21 includes a sampling circuit module 220 and a decision circuit module 230.

The sampling circuit module 220 is configured to receive the data signal DATA and plural reference clocks. The sampling circuit module 220 samples the data signal DATA according to the reference clocks and outputs the sampling result. For example, in the present exemplary embodiment, the sampling circuit module 220 includes sampling circuits 221 to 223. The sampling circuit 221 is configured to sample the data signal DATA according to a reference clock CLK_1 and output a sampling result SR_1. The sampling circuit 222 is configured to sample the data signal DATA according to a reference clock CLK_2 and output a sampling result SR_2. The sampling circuit 223 is configured to sample the data signal DATA according to a reference clock CLK_3 and output a sampling result SR_3. For example, the sampling circuits 221 to 223 sample the data signal DATA according to a raising edge or a falling edge of the reference clocks CLK_1 to CLK_3, respectively.

It is worth mentioning that, in the following exemplary embodiments, each of a number of the sampling circuits in the sampling circuit module 220, a number of the reference clocks used for sampling the data signal DATA and a number of the outputted sampling results is 3, for example. However, in another exemplary embodiment, the number of the sampling circuits in the sampling circuit module 220, the number of the reference clocks used for sampling the data signal DATA and the number of the outputted sampling results may also be more or less.

The decision circuit module 230 is coupled to the sampling circuit module 220. The decision circuit module 230 is configured to perform at least one delay operation and at least one logic operation on the sampling results and output the frequency adjustment signal FAS_1 according to said operations. Each delay operation may be performed by at least one non-inverting or inverting delay circuit. Each logic operation may be implemented as one logic gate or a logic circuit containing a plurality of logic gates. In the present exemplary embodiment, the logic operation at least include an XOR operation and an AND operation. In another exemplary embodiment, the logic operation may further include any logic operation, or may be replaced by any logic operation.

In the present exemplary embodiment, the decision circuit module 230 includes a logic circuit module 23, a delay circuit module 24, a logic circuit module 25 and a frequency adjustment circuit 26.

The logic circuit module 23 is configured to perform a logic operation (hereinafter, also known as a first logic operation) according to the sampling results SR_1 to SR_3 and output a logic result of the first logic operation.

In the present exemplary embodiment, the logic circuit module 23 includes sub logic circuits 231 and 232. The sub logic circuit 231 is configured to receive the sampling results SR_1 and SR_2. The sub logic circuit 231 performs a corresponding logic operation (hereinafter, also known as a first sub logic operation) according to the sampling results SR_1 and SR_2 and output a sub logic result LR_1. The sub logic circuit 232 is configured to receive the sampling results SR_2 and SR_3. The sub logic circuit 232 performs a corresponding logic operation (hereinafter, also known as a second sub logic operation) according to the sampling results SR_2 and SR_3 and output a sub logic result LR_2. In the present exemplary embodiment, each of the sub logic circuits 231 and 232 is one XOR gate or a logic circuit at least including one XOR gate. In the present exemplary embodiment, each of the first sub logic operation and the second sub logic operation is one XOR operation or a logic operation combination at least including one XOR operation. However, in another exemplary embodiment, the logic circuit module 23 may also include a logic circuit different from that depicted in FIG. 2.

The delay circuit module 24 is coupled to the logic circuit module 23 and configured to delay the logic result (e.g., the sub logic results LR_1 and LR_2) of the first logic operation.

In the present exemplary embodiment, the delay circuit module 24 includes delay circuits 241 and 242. The delay circuit 241 is configured to receive and delay the sub logic result LR_1 and output a delayed result LR_F. The delay circuit 242 is configured to receive and delay the sub logic result LR_2 and output a delayed result LR_2'. In the present exemplary embodiment, each of the delay circuits 241 and 242 includes at least one non-inverting or inverting delay element. Type and amount of the delay elements in the delay circuits 241 and 242 are not particularly limited in the disclosure. In the present exemplary embodiment, each of the delay circuits 241 and 242 is configured to delay a received signal by one clock cycle. However, in another exemplary embodiment, each of the delay circuits 241 and 242 may also delay the received signal by a plurality of clock cycles depending on the amount of the delay elements therein.

The logic circuit module 25 is coupled to the delay circuit module 24. The logic circuit module 25 is configured to perform another logic operation (hereinafter, also known as a second logic operation) according to the sub logic results LR_1 and LR_2 and the delayed results LR_1' (i.e., the delayed logic result LR_1) and LR_2' (i.e., the delayed logic result LR_2) and output a logic result of the second logic operation.

In the present exemplary embodiment, the logic circuit module 25 includes sub logic circuits 251 and 252. The sub logic circuit 251 is configured to receive the sub logic result LR_2 and the delayed result LR_1'. The sub logic circuit 251 performs a corresponding logic operation (hereinafter, also known as a third sub logic operation) according to the sub logic result LR_2 and the delayed result LR_1' and outputs a sub logic result LR_3. The sub logic circuit 252 is configured to receive the sub logic result LR_1 and the delayed result LR_2'. The sub logic circuit 252 performs a corresponding logic operation (hereinafter, also known as a fourth sub logic operation) according to the sub logic result LR_1 and the delayed result LR_2' and outputs a sub logic result LR_4. In the present exemplary embodiment, each of the sub logic circuits 251 and 252 is one AND gate or a logic circuit at least including one AND gate. In the present exemplary embodiment, each of the third sub logic operation and the fourth sub logic operation is one AND operation or a logic operation combination at least including one AND operation. However, in another exemplary embodiment, the logic circuit module 25 may also include a logic circuit different from that depicted in FIG. 2.

The frequency adjustment circuit 26 is coupled to the logic circuit module 25. The frequency adjustment circuit 26 is configured to generate and output the frequency adjustment signal FAS_1 according to the logic result (e.g., the sub logic results LR_3 and LR_4) of the second logic operation. The frequency adjustment signal FAS_1 may be an frequency up adjustment signal or a frequency down adjustment signal. The frequency up adjustment signal is configured to increase the frequency of the feedback clock CLK_FB. The frequency down adjustment signal is configured to reduce the frequency of the feedback clock CLK_FB. For example, the frequency adjustment circuit 26 receives the sub logic result LR_3 and determines whether the sub logic result LR_3 matches a preset condition (hereinafter, also known as a first condition). The frequency adjustment circuit 26 outputs the frequency up adjustment signal if the sub logic result LR_3 matches the first condition. The frequency adjustment circuit 26 does not output the frequency up adjustment signal if the sub logic result LR_3 does not match the first condition. For example, the frequency adjustment circuit 26 receives the sub logic result LR_4 and determines whether the sub logic result LR_4 matches another preset condition (hereinafter, also known as a second condition). The frequency adjustment circuit 26 outputs the frequency down adjustment signal if the sub logic result LR_4 matches the second condition. The frequency adjustment circuit 26 does not output the frequency down adjustment signal if the sub logic result LR_4 does not match the second condition. In an exemplary embodiment, the frequency adjustment circuit 26 may include at least one filter circuit. For example, the frequency adjustment circuit 26 outputs the frequency up adjustment signal only when the sub logic result LR_3 is at one preset state (e.g., at the logical level "1"); and the frequency adjustment circuit 26 outputs the frequency down adjustment signal only when the sub logic result LR_4 is at another preset state (e.g., at the logical level "1").

Figure 3:
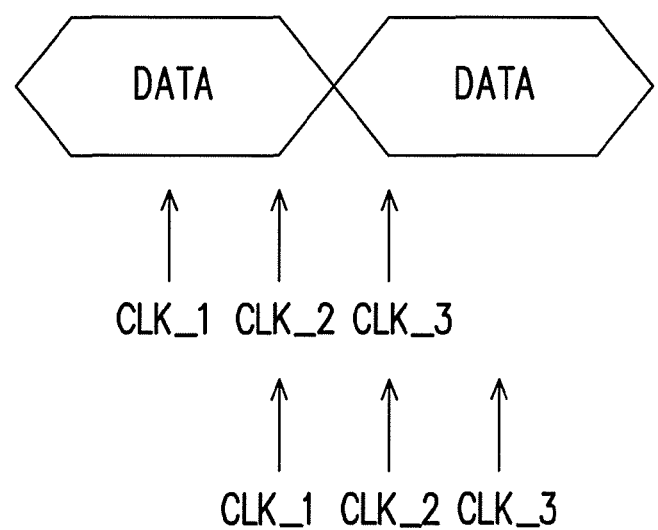
FIG. 3 and FIG. 5 are schematic diagrams illustrating the processing of sampling results according to an exemplary embodiment of the disclosure.
Figure 5:
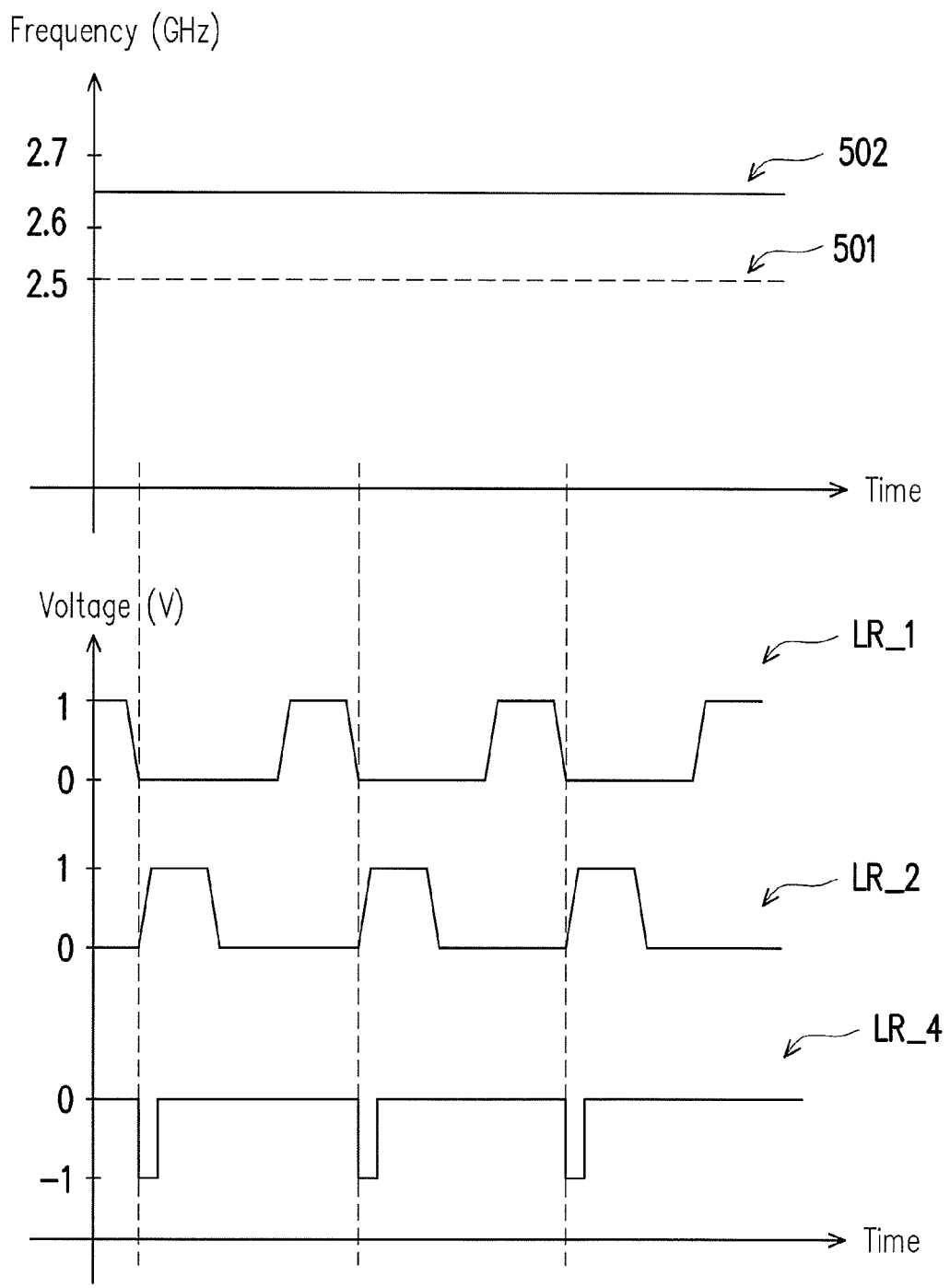

FIG. 3 and FIG. 5 are schematic diagrams illustrating the processing of sampling results according to an exemplary embodiment of the disclosure.

Figure 4:
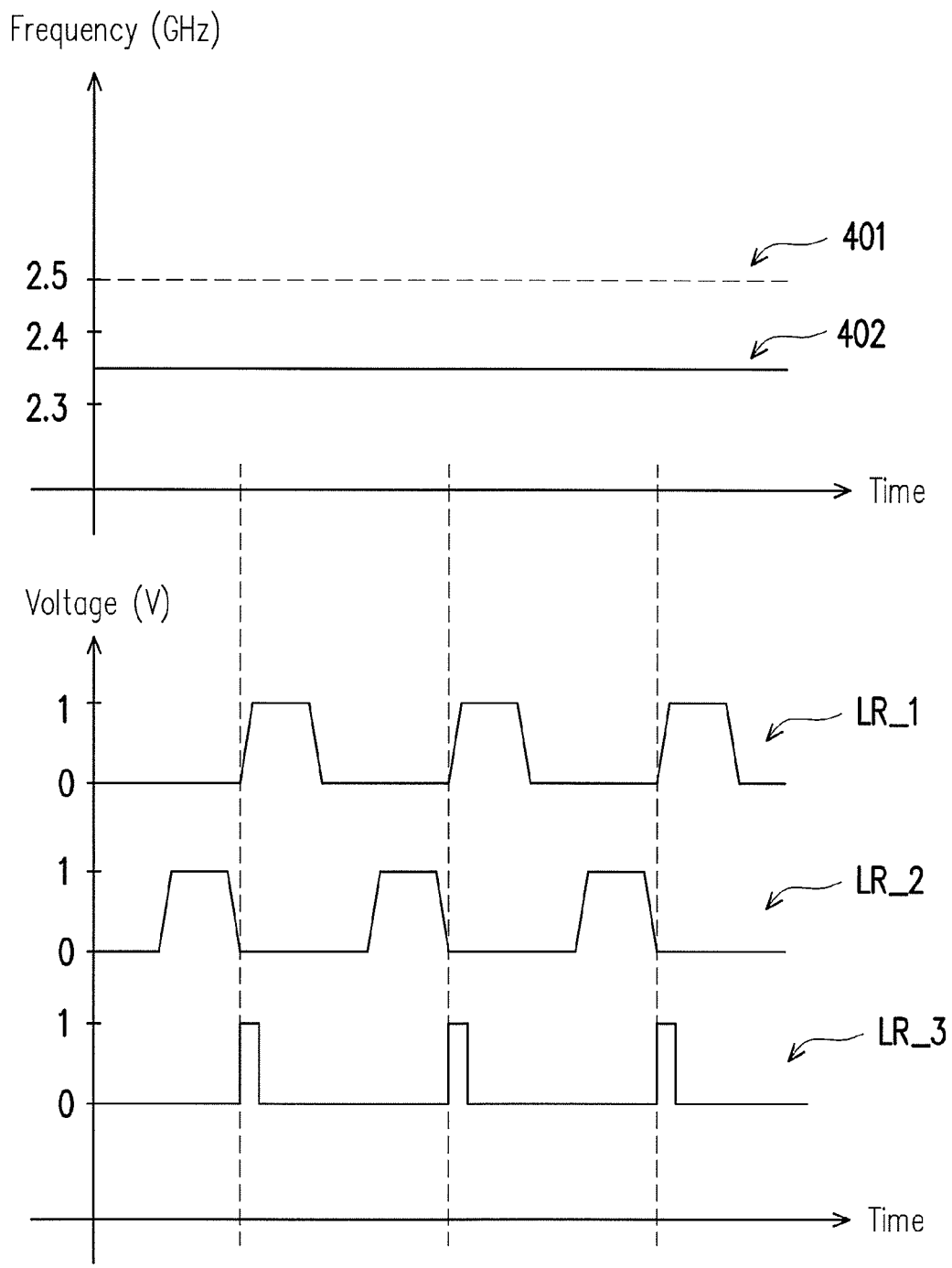

Referring to FIG. 2 to FIG. 4 together, in the case where a frequency value 402 of the feedback clock CLK_FB is lower than a frequency value 401 of the data signal DATA in a time interval, the sampling results SR_1 to SR_3 may be obtained after sampling the data signal DATA according to the reference clocks CLK_1 to CLK_3. The sub logic result LR_1 may be obtained after performing the XOR operation on the sampling results SR_1 and SR_2. The sub logic result LR_2 may be obtained after performing the XOR operation on the sampling results SR_2 and SR_3. For example, waveforms of the sub logic results LR_1 and LR_2 are as shown by FIG. 4, but the disclosure is not limited thereto. After delaying the sub logic result LR_1 by one clock cycle, the AND operation is performed on the delayed sub logic result LR_1 (i.e., the delayed result LR_1') and the sub logic result LR_2, and the logical level "1" of the sub logic result LR_3 is obtained. Accordingly, the frequency adjustment circuit 26 outputs the frequency up adjustment signal.

Referring to FIG. 2, FIG. 3 and FIG. 5 together, in the case where a frequency value 502 of the feedback clock CLK_FB is higher than a frequency value 501 of the data signal DATA in another time interval, the sampling results SR_1 to SR_3 may be obtained after sampling the data signal DATA according to the reference clocks CLK_1 to CLK_3. The sub logic result LR_1 may be obtained after performing the XOR operation on the sampling results SR_1 and SR_2. The sub logic result LR_2 may be obtained after performing the XOR operation on the sampling results SR_2 and SR_3. For example, waveforms of the sub logic results LR_1 and LR_2 are as shown by FIG. 5, but the disclosure is not limited thereto. After delaying the sub logic result LR_2 by one clock cycle, if the AND operation is performed on the sub logic result LR_1 and the delayed sub logic result LR_2 (i.e., the delayed result LR_2'), the logical level "1" of the sub logic result LR_4 is obtained. Accordingly, the frequency adjustment circuit 26 outputs the frequency down adjustment signal.

It is worth mentioning that, the decision circuit module of the disclosure is not limited to the circuit layout shown by the exemplary embodiment of FIG. 2, and the logic operations that the decision circuit module may perform are not limited to the above either. In another exemplary embodiment, if the decision circuit module includes the logic circuit having different logic gates and/or the circuit layout of the logic circuits in the decision circuit module is changed, the logic operation corresponding to each logic circuit may also be changed accordingly, which is not particularly limited in the disclosure. Further, in another exemplary embodiment, if the circuit layout of the decision circuit module is different from the circuit layout shown by the exemplary embodiment of FIG. 2, settings of the frequency adjustment circuit for said first condition and said second condition may also be changed without being limited to the settings in the exemplary embodiments of FIG. 2 to FIG. 5.

Referring back to FIG. 1, the clock control circuit 12 may further include a charge pump 121, a low pass filter circuit 122 and a voltage control oscillation circuit 123.

The charge pump 121 is coupled to the data frequency detection circuit 11. The charge pump 121 is configured to charge/discharge one or more capacitors in the charge pump 121 according to the frequency adjustment signal FAS_1 in order to output a frequency adjustment voltage FAV_1. For example, in response to the frequency up adjustment signal, the charge pump 121 outputs the frequency adjustment voltage FAV_1 configured to increase the frequency of the feedback clock CLK_FB; and in response to the frequency down adjustment signal, the charge pump 121 outputs the frequency adjustment voltage FAV_1 configured to reduce the frequency of the feedback clock CLK_FB.

The low pass filter circuit 122 is coupled to the charge pump 121. The low pass filter circuit 122 is configured to output a frequency control voltage FCV according to the frequency adjustment voltage FAV_1.

The voltage control oscillation circuit 123 is coupled to the low pass filter circuit 122. The voltage control oscillation circuit 123 is configured to output the feedback clock CLK_FB according to the frequency control voltage FCV. For example, the voltage control oscillation circuit 123 may include a crystal oscillator such as a quartz-crystal oscillator, or a non-crystal oscillator. If a voltage value of the frequency control voltage FCV is increased, the frequency of the feedback clock CLK_FB may be increased. If the voltage value of the frequency control voltage FCV is reduced, the frequency of the feedback clock CLK_FB may be reduced.

In another exemplary embodiment, the clock control circuit 12 further includes a phase detection circuit 124 and a charge pump 125.

The phase detection circuit 124 is coupled to the voltage control oscillation circuit 123. The phase detection circuit 124 is configured to detect and output a phase difference PD between the data signal DATA and the feedback clock CLK_FB.

The charge pump 125 is coupled to the phase detection circuit 124. The charge pump 125 is configured to charge/discharge one or more capacitors in the charge pump 125 according to the phase difference PD in order to output a frequency adjustment voltage FAV_2. In this way, the low pass filter circuit 122 is also capable of receiving the frequency adjustment voltage FAV_2 and outputting the frequency control voltage FCV to the voltage control oscillation circuit 123 according to at least one of the frequency adjustment voltages FAV_1 and FAV_2. Herein, according to the present exemplary embodiment, the charge pump 125 and the low pass filter circuit 122 may be combined into an integral gain converter (Ki converter).

In another exemplary embodiment, the clock control circuit 12 further includes a converter circuit 126.

The converter circuit 126 is coupled to the phase detection circuit 124. The converter circuit 126 is configured to output phase control voltages PCV_1 and PCV_2 according to the phase difference PD. The phase control voltages PCV_1 and PCV_2 are synchronously outputted to the voltage control oscillation circuit 123 and used to control the frequency of the feedback clock CLK_FB at the same time. The voltage control oscillation circuit 123 receives the phase control voltages PCV_1 and PCV_2 and outputs the feedback clock CLK_FB according to the phase control voltages PCV_1 and PCV_2. Herein, according to the present exemplary embodiment, the converter circuit 126 may be a proportional gain converter (Kp converter), for example.

It is worth mentioning that, in the present exemplary embodiment, the frequency control voltage FCV is configured to perform a coarse adjustment on the frequency of the feedback clock CLK_FB, whereas the phase control voltages PCV_1 and PCV_2 are configured to perform a fine adjustment on the frequency of the feedback clock CLK_FB at the same time. For example, if a frequency difference between the frequency of the feedback clock CLK_FB and the frequency of the data signal DATA is greater (e.g., said difference is greater than a threshold), the frequency control voltage FCV is mainly used to perform a greater degree of adjustment on the frequency of the feedback clock CLK_FB, so as to accelerate the speed for catching up the frequency of the data signal DATA; and if the frequency of the feedback clock CLK_FB and the frequency of the data signal DATA are already very close (e.g., said difference is less than said threshold), the phase control voltages PCV_1 and PCV_2 are mainly used to perform a smaller degree of adjustment on the frequency of the feedback clock CLK_FB, so as to accurately lock the frequency of the feedback clock CLK_FB at the frequency of the data signal DATA.

FIG. 6 is a schematic diagram illustrating a converter circuit according to an exemplary embodiment of the disclosure.

Referring to FIG. 6, a converter circuit 626 includes a phase adjustment circuit 631, an inverter circuit 632 and a phase control circuit 633.

The phase adjustment circuit 631 is configured to generate and output phase adjustment signals PAS_1 and PAS_2 according to the phase difference PD. The phase adjustment signal PAS_1 is configured to instruct increasing the frequency of the feedback CLK_FB. The phase adjustment signal PAS_2 is configured to instruct reducing the frequency of the feedback CLK_FB.

The inverter circuit 632 is coupled to the phase adjustment circuit 631. The inverter circuit 632 is configured to receive the phase adjustment signal PAS_2 and invert the phase adjustment signal PAS_2. For example, if the logical level of the phase adjustment signal PAS_2 is "1," the logical level of the inverted phase adjustment signal PAS_2 becomes "0"; and if the logical level of the phase adjustment signal PAS_2 is "0," the logical level of the inverted phase adjustment signal PAST becomes "1." For example, the inverter circuit 632 includes one or more inverting elements (e.g., inverters). The inverter circuit 632 outputs a phase adjustment signal PAST' (i.e., the inverted phase adjustment signal PAS_2).

The phase control circuit 633 is coupled to the phase adjustment circuit 631 and the inverter circuit 632. The phase control circuit 633 is configured to receive the phase adjustment signal PAS_1 and the phase adjustment signal PAS_2' and output the phase control voltages PCV_1 and PCV_2 according to the phase adjustment signal PAS_1 and the phase adjustment signal PAS_2'. In the present exemplary embodiment, the phase control voltages PCV_1 and PCV_2 are synchronously outputted. However, in another exemplary embodiment, based on different usage scenarios, it is also possible that only one of the phase control voltages PCV_1 and PCV_2 is outputted.

FIG. 7 is a schematic diagram illustrating the corresponding frequency shifts based on the phase control signal according to an exemplary embodiment of the disclosure. FIG. 8 is a schematic diagram illustrating a voltage control oscillation circuit according to an exemplary embodiment of the disclosure.

Referring to FIG. 7 and FIG. 8, it is assumed that the logical level "1" of the phase adjustment signal PAS_1 instructs to increase the frequency of the feedback clock CLK_FB, and the logical level "1" of the phase adjustment signal PAS_2 instructs to reduce the frequency of the feedback clock CLK_FB. Further, in the case where a voltage control oscillation circuit 823 includes an inductor L and capacitors C1 to C3, the phase control voltage PCV_1 is configured to be outputted to the capacitor C1 in the voltage control oscillation circuit 823, and the phase control voltage PCV_2 is configured to be outputted to the capacitor C2 in the voltage control oscillation circuit 823.

If the logical level of the phase adjustment signal PAS_1 is "0" and the logical level of the phase adjustment signal PAS_2 is "0," a preset frequency shift is "+5 MHz," however, after being processed by the phase control circuit 633 and the voltage control oscillation circuit 123, an actual frequency shift is controlled at "0 MHz" (i.e., the frequency of the feedback clock CLK_FB is not changed), which matches instructions of the phase adjustment signals PAS_1 and PAS_2.

If the logical level of the phase adjustment signal PAS_1 is "0" and the logical level of the phase adjustment signal PAS_2 is "1," the preset frequency shift is "0 MHz"; however, after being processed by the phase control circuit 633 and the voltage control oscillation circuit 123, the actual frequency shift is controlled at "−5 MHz" (i.e., the frequency of the feedback clock CLK_FB is reduced), which matches instructions of the phase adjustment signals PAS_1 and PAS_2.

If the logical level of the phase adjustment signal PAS_1 is "1" and the logical level of the phase adjustment signal PAS_2 is "0," the preset frequency shift is "+10 MHz"; however, after being processed by the phase control circuit 633 and the voltage control oscillation circuit 123, an actual frequency shift is controlled at "+5 MHz" (i.e., the frequency of the feedback clock CLK_FB is increased), which matches instructions of the phase adjustment signals PAS_1 and PAS_2.

If the logical level of the phase adjustment signal PAS_1 is "1" and the logical level of the phase adjustment signal PAS_2 is "1," the preset frequency shift is "+5 MHz"; however, after being processed by the phase control circuit 633 and the voltage control oscillation circuit 123, an actual frequency shift is controlled at "0 MHz" (i.e., the frequency of the feedback clock CLK_FB is not changed), which matches instructions of the phase adjustment signals PAS_1 and PAS_2.

In the present exemplary embodiment, an anti-interference capability for noises may be improved by using two phase control signals to instruct increasing and reducing the frequency of the feedback clock CLK_FB respectively and inverting one of said phase control signals. Particularly, a mismatching effect for the charge pump may also be improved.

Figure 9:
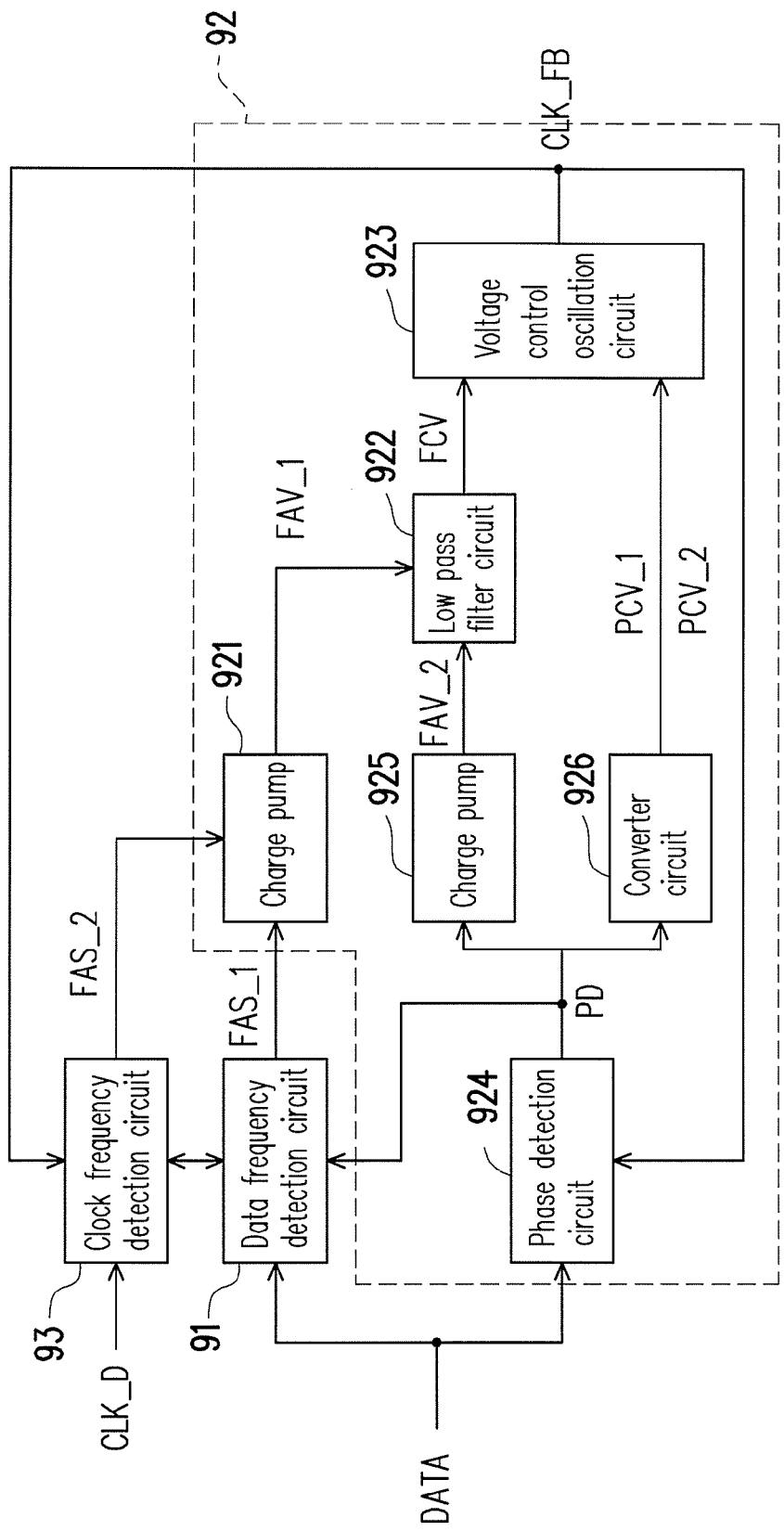
FIG. 9 is a schematic diagram illustrating a clock and data recovery circuit module according to another exemplary embodiment of the disclosure.

FIG. 9 is a schematic diagram illustrating a clock and data recovery circuit module according to another exemplary embodiment of the disclosure.

Referring to FIG. 9, a clock and data recovery circuit module 90 includes a data frequency detection circuit 91, a clock control circuit 92 and a clock frequency detection circuit 93. The clock control circuit 92 may include a charge pump 921, a low pass filter circuit 922, a voltage control oscillation circuit 923, a phase detection circuit 924, a charge pump 925 and a converter circuit 926. Nonetheless, the data frequency detection circuit 91 and the clock control circuit 92 are identical or similar to the data frequency detection circuit 11 and the clock control circuit 12 in FIG. 1 respectively, and thus related description thereof is not repeated hereinafter.

The clock frequency detection circuit 93 is coupled to the charge pump 921. The clock frequency detection circuit 93 is configured to detect a frequency difference between the feedback clock CLK_FB and a preset reference clock CLK_D and output a frequency adjustment signal FAS_2 according to the frequency difference. The charge pump 921 outputs the frequency adjustment voltage FAV_1 according to at least one of the frequency adjustment signal FAS_1 and the frequency adjustment signal FAS_2.

Generally, a frequency of the preset reference clock CLK_D is far lower than the frequency of the data signal DATA, and thus a system power consumption in the operation of the clock frequency detection circuit 93 is less than the system power consumption in the operation of the data frequency detection circuit 91. Yet, as compared to the data frequency detection circuit 91, a locking capability of the clock frequency detection circuit 93 for frequency/phase is relatively poor. Particularly, when a frequency jitter occurs on the data signal DATA, the locking capability of the clock frequency detection circuit 93 for frequency/phase reduces substantially.

In the present exemplary embodiment, under normal circumstances, the clock frequency detection circuit 93 is activated, whereas the data frequency detection circuit 91 is not activated. Herein, the normal circumstances refer to circumstances where the frequency of the data signal DATA is relatively stable (e.g., when a frequency variation of the data signal DATA is less than a preset value within a preset time range). In this way, with the operation of clock frequency detection circuit 93, a basic locking capability for frequency/phase may be maintained while saving the system power consumption. However, under circumstances where the frequency of the data signal DATA is relatively unstable, the data frequency detection circuit 91 is activated to improve the locking capability for the frequency/phase of the data signal DATA. Herein, the circumstances where the frequency of the data signal DATA is relatively unstable refer to, for example, when the frequency jitter occurs on the data signal DATA. For instance, if the frequency variation of the data signal DATA is greater than the preset value within a preset time range, it can be determined that the frequency of the data signal DATA is relatively unstable. Later, if the frequency of the data signal DATA is back to stable, the data frequency detection circuit 91 will be turned off.

It is worth mentioning that, in an exemplary example, the clock and data recovery circuit module as mentioned in the foregoing exemplary embodiments is applied in a memory storage device or a memory control circuit unit for controlling the memory storage device. Nevertheless, in another exemplary embodiment, the clock and data recovery circuit module may also be applied in any data transmission device.

Generally, a memory storage device (also known as a memory storage system) includes a rewritable non-volatile memory module and a controller (also known as a control circuit). The memory storage device is usually configured together with a host system so that the host system may write data into the memory storage device or read data from the memory storage device.

Figure 10:
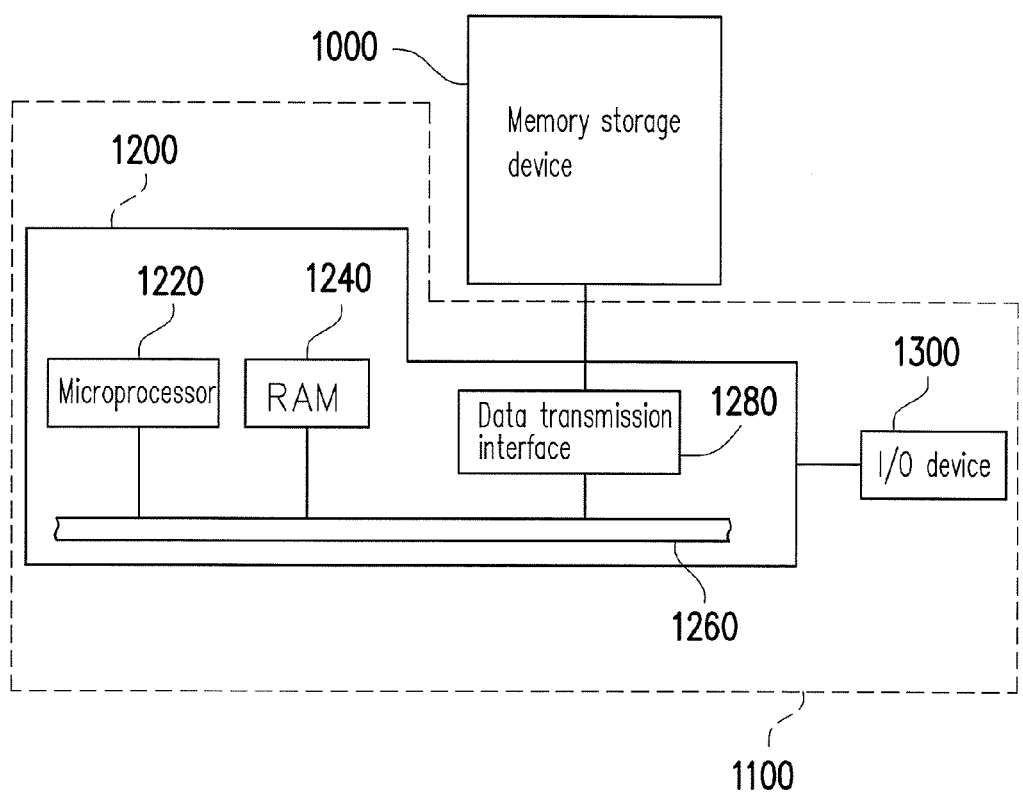
FIG. 10 is a schematic diagram illustrating a host system and a memory storage device according to an exemplary embodiment of the disclosure.
Figure 11:
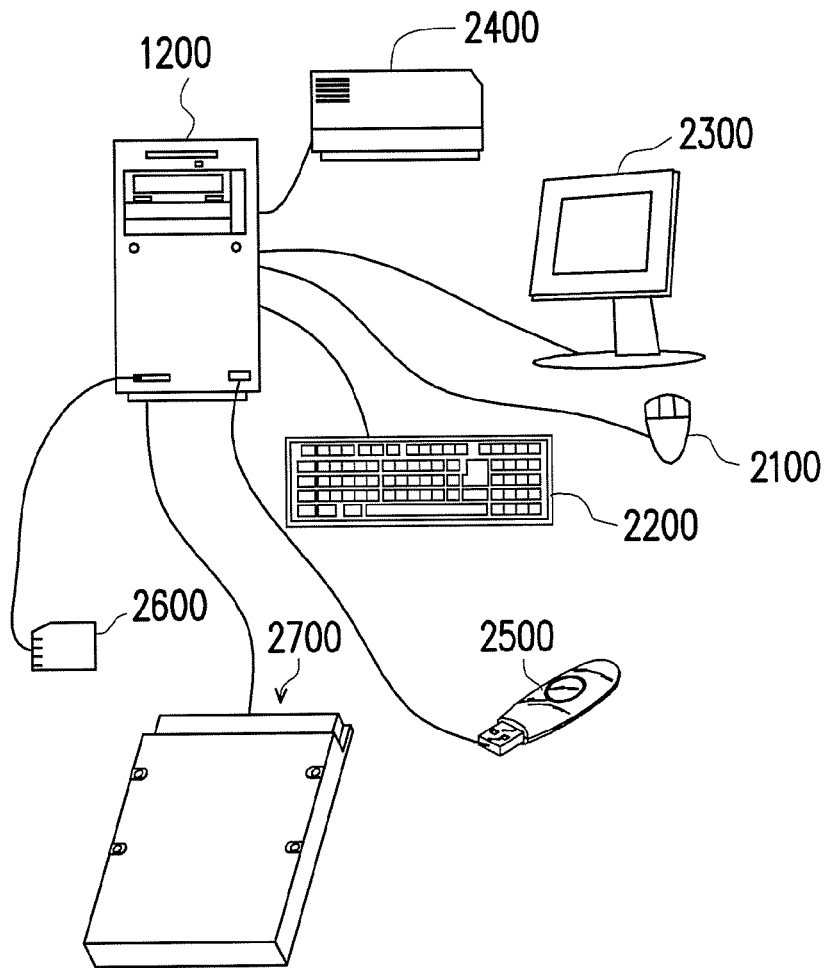
FIG. 11 is a schematic diagram of a computer, an input/output device, and a memory storage device according to an exemplary embodiment of the disclosure.

FIG. 10 is a schematic diagram illustrating a host system and a memory storage device according to an exemplary embodiment of the disclosure. FIG. 11 is a schematic diagram of a computer, an input/output device, and a memory storage device according to an exemplary embodiment of the disclosure.

Referring to FIG. 10, a host system 1100 includes a computer 1200 and an input/output (I/O) device 1300. The computer 1200 includes a microprocessor 1220, a random access memory (RAM) 1240, a system bus 1260, and a data transmission interface 1280. For example, the I/O device 1300 includes a mouse 2100, a keyboard 2200, a display 2300 and a printer 2400 as shown in FIG. 11. It should be understood that the devices illustrated in FIG. 11 are not intended to limit the I/O device 1300, and the I/O device 1300 may further include other devices.

In an exemplary embodiment, the memory storage device 1000 is coupled to other devices of the host system 1100 through the data transmission interface 1280. By using the microprocessor 1220, the random access memory 1240 and the Input/Output (I/O) device 130, data may be written into the memory storage device 1000 or may be read from the memory storage device 1000. For example, the memory storage device 1000 may be a rewritable non-volatile memory storage device such as a flash drive 2500, a memory card 2600, or a solid state drive (SSD) 2700 as shown in FIG. 11.

Figure 12:
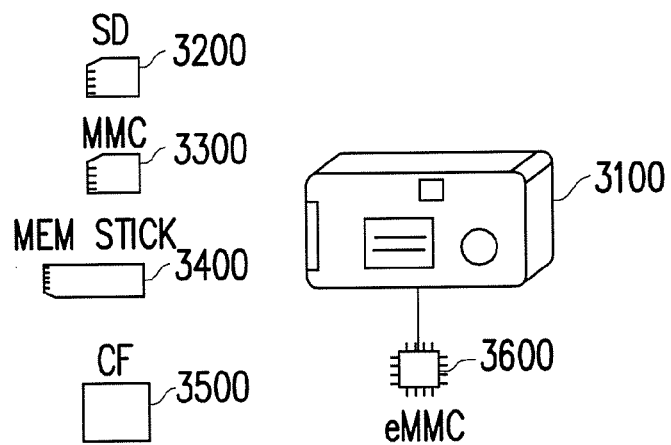
FIG. 12 is a schematic diagram illustrating a host system and a memory storage device according to an exemplary embodiment of the disclosure.

FIG. 12 is a schematic diagram illustrating a host system and a memory storage device according to an exemplary embodiment of the disclosure.

Generally, the host system 1100 may substantially be any system capable of storing data with the memory storage device 1000. Even though the host system 1100 is illustrated as a computer system in the present exemplary embodiment, however, in another exemplary embodiment of the present disclosure, the host system 1100 may be a digital camera, a video camera, a telecommunication device, an audio player, or a video player. For example, when the host system is a digital camera (video camera) 3100, the rewritable non-volatile memory storage device may be a SD card 3200, a MMC card 3300, a memory stick 3400, a CF card 3500 or an embedded storage device 3600 (as shown in FIG. 12). The embedded storage device 3600 includes an embedded MMC (eMMC). It should be mentioned that the eMMC is directly coupled to a substrate of the host system.

Figure 13:
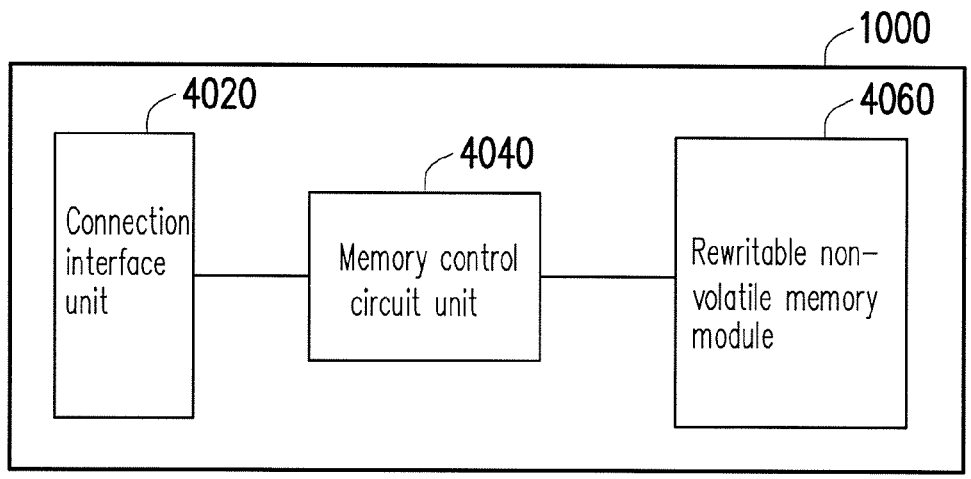
FIG. 13 is a schematic block diagram illustrating the memory storage device depicted in FIG. 10.

FIG. 13 is a schematic block diagram illustrating the memory storage device depicted in FIG. 10.

Referring to FIG. 13, the memory storage device 1000 includes a connection interface unit 4020, a memory control circuit unit 4040 and a rewritable non-volatile memory module 4060.

In the present exemplary embodiment, the connection interface unit 4020 is compatible with a serial advanced technology attachment (SATA) standard. However, the disclosure is not limited thereto, and the connection interface unit 4020 may also be compatible to a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 4020 and the memory control circuit unit 4040 may be packaged into one chip, or the connection interface unit 4020 is distributed outside of a chip containing the memory control circuit unit 4040.

In an exemplary embodiment, the clock and data recovery circuit module as mentioned in the foregoing exemplary embodiments is disposed in the connection interface unit 4020, so as to receive the data signal DATA from the host system 1100 and output the feedback clock CLK_FB for sampling the data signal DATA. Further, in another exemplary embodiment, the feedback clock CLK_FB may also be used for other purposes (e.g., to be transmitted back to the host system 1100 for synchronization of data frequency), which are not particularly limited by the disclosure.

The memory control circuit unit 4040 is configured to execute a plurality of logic gates or control commands which are implemented in a hardware form or in a firmware form and execute operations of writing, reading or erasing data in the rewritable non-volatile memory storage module 4060 according to the commands of the host system 1100.

The rewritable non-volatile memory module 4060 is coupled to the memory control circuit unit 4040 and configured to store data written from the host system 1100. The rewritable non-volatile memory module 4060 may be a Single Level Cell (SLC) NAND flash memory module (i.e., a flash memory module capable of storing one bit data in one memory cell), a Multi Level Cell (MLC) NAND flash memory module (i.e., a flash memory module capable of storing two bit data in one memory cell), a Triple Level Cell (TLC) NAND flash memory module (i.e., a flash memory module capable of storing three bit data in one memory cell), other flash memory modules or any memory module having the same features.

Each of the memory cells in the rewritable non-volatile memory module 4060 may store one or more bits by changing a threshold voltage of the memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell." Each of the memory cells in the rewritable non-volatile memory module 4060 has a plurality of storage statuses depended on changes in the threshold voltage. Moreover, which of the storage statuses is the memory cell belongs to may be determined by read voltages, so as to obtain the one or more bits stored in the memory cell.

The memory cells of the rewritable non-volatile memory module 4060 constitute a plurality of physical programming units, and the physical programming units constitute a plurality of physical erasing units. Specifically, the memory cells on the same word line constitute one or more of the physical programming units. If each of the memory cells can store more than two bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is faster than a writing speed of the upper physical programming unit, or a reliability of the lower physical programming unit is higher than a reliability of the upper physical programming unit. In the present exemplary embodiment, the physical programming unit is a minimum unit for programming. That is, the programming unit is the minimum unit for writing data. For example, the physical programming unit is a physical page or a physical sector. If the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, the data bit area contains 32 physical sectors, and a size of each physical sector is 512-byte (B). However, in other exemplary embodiments, the data bit area may also include 8, 16, or more or less of the physical sectors, and amounts and sizes of the physical sectors are not limited in the disclosure. On the other hand, the physical erasing unit is the minimal unit for erasing. Namely, each physical erasing unit contains the least number of memory cells to be erased together. For instance, the physical erasing unit is a physical block.

Figure 14:
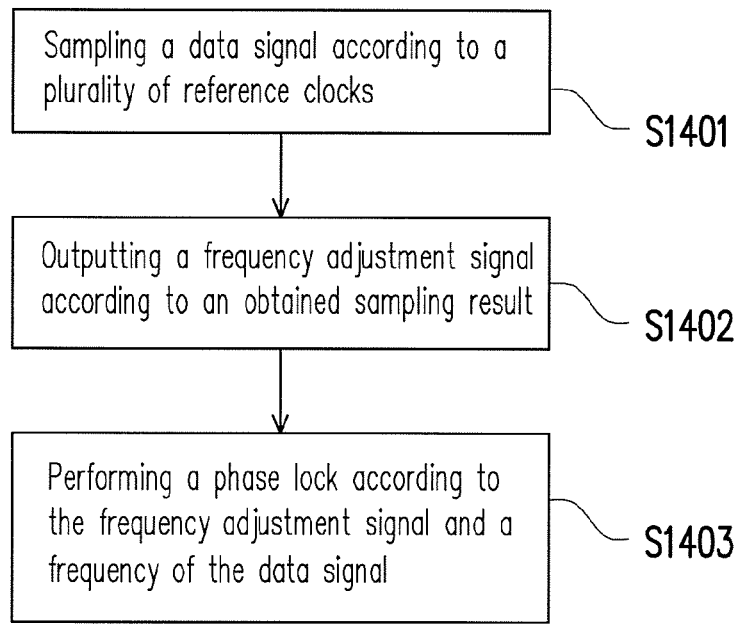
FIG. 14 is a flow chart illustrating a phase lock method according to an exemplary embodiment of the disclosure.

FIG. 14 is a flow chart illustrating a phase lock method according to an exemplary embodiment of the disclosure.

Referring to FIG. 14 in step S1401, a data signal is sampled according to a plurality of reference clocks. In step S1402, a frequency adjustment signal is obtained according to an obtained sampling result. In step S1403, a phase lock is performed according to the frequency adjustment signal and a frequency of the data signal.

Nevertheless, steps depicted in FIG. 14 are described in detail as above, thus related description is omitted hereinafter. It should be noted that, the steps depicted in FIG. 14 may be implemented as a plurality of program codes or circuits, which are not particularly limited in the disclosure. Moreover, the method disclosed in FIG. 14 may be implemented by reference with above exemplary embodiments, or may be implemented separately, which are not particularly limited in the disclosure.

In summary, the disclosure is capable of sampling the data signal according to multiple reference clocks, determining the condition matched by the sampling result by performing the logic operation with lower complexity, and generating the corresponding frequency adjustment signal according to the condition matched by the sampling result in order to perform subsequent process for the phase lock. Accordingly, as compared to the traditional clock and data recovery circuit, the disclosure may complete the phase lock based on lower system power consumption and lower circuit complexity.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory storage device, comprising:
a connection interface unit, configured to couple to a host system;
a rewritable non-volatile memory module comprising a plurality of physical erasing units; and
a memory control circuit unit, coupled to the connection interface unit and the rewritable non-volatile memory module,
wherein the connection interface unit comprises a clock and data recovery circuit module,
wherein the clock and data recovery circuit module comprises a data frequency detection circuit and a clock control circuit,
wherein the data frequency detection circuit comprises:
a sampling circuit module, comprising a plurality of sampling circuits and configured to sample a data signal according to a plurality of reference clocks and output a sampling result;
a first logic circuit module, coupled to the sampling circuits and configured to perform a first logic operation according to the sampling result and output a first logic result;
a delay circuit module, coupled to the first logic circuit module and configured to delay the first logic result and output the delayed first logic result;
a second logic circuit module, coupled to the delay circuit module and configured to perform a second logic operation according to the first logic result and the delayed first logic result and output a second logic result; and
a frequency adjustment circuit, coupled to the second logic circuit module and configured to output a first frequency adjustment signal according to the second logic result,
wherein the clock control circuit is coupled to the data frequency detection circuit and configured to perform a phase lock according to the first frequency adjustment signal and a frequency of the data signal.

2. The memory storage device of claim 1, wherein the reference clocks comprise a first reference clock, a second reference clock and a third reference clock, and the sampling circuit module comprises:
a first sampling circuit, configured to sample the data signal according to the first reference clock and output a first sampling result;
a second sampling circuit, configured to sample the data signal according to the second reference clock and output a second sampling result; and
a third sampling circuit, configured to sample the data signal according to the third reference clock and output a third sampling result.

3. The memory storage device of claim 1, wherein the sampling result comprises a first sampling result, a second sampling result and a third sampling result, and the first logic circuit module comprises:
a first sub logic circuit, configured to perform a first sub logic operation according to the first sampling result and the second sampling result and output a first sub logic result; and
a second sub logic circuit, configured to perform a second sub logic operation according to the second sampling result and the third sampling result and output a second sub logic result.

4. The memory storage device of claim 1, wherein the first logic result comprises a first sub logic result and a second sub logic result, and the delay circuit module comprises:
a first delay circuit, configured to delay the first sub logic result and output a first delayed result; and
a second delay circuit, configured to delay the second sub logic result and output a second delayed result.

5. The memory storage device of claim 1, wherein the first logic result comprises a first sub logic result and a second sub logic result, the delayed first logic result comprises a first delayed result obtained by delaying the first sub logic result and a second delayed result obtained by delaying the second sub logic result, and the second logic circuit module comprises:
a third sub logic circuit, configured to perform a third sub logic operation according to the second sub logic result and the first delayed result and output a third sub logic result; and
a fourth sub logic circuit, configured to perform a fourth sub logic operation according to the first sub logic result and the second delayed result and output a fourth sub logic result.

6. The memory storage device of claim 1, wherein the frequency adjustment circuit is configured to output an frequency up adjustment signal if the second logic result matches a first condition,
wherein the frequency adjustment circuit is configured to output a frequency down adjustment signal if the second logic result matches a second condition.

7. The memory storage device of claim 1, wherein the clock control circuit comprises:
a first charge pump, coupled to the data frequency detection circuit and configured to output a first frequency adjustment voltage according to the first frequency adjustment signal;
a low pass filter circuit, coupled to the first charge pump and configured to output a frequency control voltage according to the first frequency adjustment voltage; and
a voltage control oscillation circuit, coupled to the low pass filter circuit and configured to output a feedback clock according to the frequency control voltage.

8. The memory storage device of claim 7, wherein the clock control circuit further comprises:
a phase detection circuit, coupled to the voltage control oscillation circuit and configured to detect a phase difference between the data signal and the feedback clock; and
a second charge pump, coupled to the phase detection circuit and configured to output a second frequency adjustment voltage according to the phase difference,
wherein the low pass filter circuit is further configured to output the frequency control voltage according to the second frequency adjustment voltage.

9. The memory storage device of claim 8, wherein the clock control circuit further comprises:
a converter circuit, coupled to the phase detection circuit and configured to output a first phase control voltage and a second phase control voltage according to the phase difference,
wherein the voltage control oscillation circuit is further configured to receive the first phase control voltage and the second phase control voltage and output the feedback clock according to the first phase control voltage and the second phase control voltage.

10. The memory storage device of claim 9, wherein the converter circuit comprises:
a phase adjustment circuit, configured to output a first phase adjustment signal and a second phase adjustment signal according to the phase difference;
an inverter circuit, coupled to the phase adjustment circuit and configured to invert the second phase adjustment signal; and
a phase control circuit, coupled to the phase adjustment circuit and the inverter circuit and configured to output the first phase control voltage and the second phase control voltage according to the first phase adjustment signal and the inverted second phase adjustment signal.

11. The memory storage device of claim 7, wherein the clock and data recovery circuit module further comprises:
a clock frequency detection circuit, coupled to the first charge pump,
wherein the clock frequency detection circuit is configured to detect a frequency difference between the feedback clock and a preset reference clock and output a second frequency adjustment signal according to the frequency difference,
wherein the first charge pump is further configured to output the first frequency adjustment voltage according to the second frequency adjustment signal,
wherein the data frequency detection circuit is activated only when a frequency variation of the data signal is greater than a preset value.

12. A memory storage device, comprising:
a connection interface unit, configured to couple to a host system;
a rewritable non-volatile memory module comprising a plurality of physical erasing units; and
a memory control circuit unit, coupled to the connection interface unit and the rewritable non-volatile memory module,
wherein the connection interface unit comprises a clock and data recovery circuit module,
wherein the clock and data recovery circuit module comprises:
a phase detection circuit, configured to detect a phase difference between a data signal and a feedback clock;
a converter circuit, coupled to the phase detection circuit and configured to output a first phase control voltage and a second phase control voltage according to the phase difference; and
a voltage control oscillation circuit, coupled to the converter circuit,
wherein the voltage control oscillation circuit is configured to receive the first phase control voltage and the second phase control voltage and output the feedback clock according to the first phase control voltage and the second phase control voltage.

13. The memory storage device of claim 12, wherein the converter circuit comprises:
a phase adjustment circuit, configured to output a first phase adjustment signal and a second phase adjustment signal according to the phase difference;
an inverter circuit, coupled to the phase adjustment circuit and configured to invert the second phase adjustment signal; and
a phase control circuit, coupled to the phase adjustment circuit and the inverter circuit and configured to output the first phase control voltage and the second phase control voltage according to the first phase adjustment signal and the inverted second phase adjustment signal.

\* \* \* \* \*